United States Patent
Tari et al.

(10) Patent No.: US 11,344,462 B2
(45) Date of Patent: May 31, 2022

(54) PERSON LIFTING APPARATUSES INCLUDING LIFTING STRAPS AND METHODS OF OPERATION BASED ON CURRENT DRAW

(71) Applicant: Liko Research & Development AB, Luleå (SE)

(72) Inventors: Joseph Tari, Batesville, IN (US); Derek Strassle, Batesville, IN (US)

(73) Assignee: Liko Research & Development AB, Luleå (SE)

( * ) Notice: Subject to any disclaimer, the term of this patent is extended or adjusted under 35 U.S.C. 154(b) by 121 days.

(21) Appl. No.: 16/576,019

(22) Filed: Sep. 19, 2019

(65) Prior Publication Data

US 2020/0085659 A1 Mar. 19, 2020

Related U.S. Application Data

(60) Provisional application No. 62/878,508, filed on Jul. 25, 2019, provisional application No. 62/733,354, filed on Sep. 19, 2018.

(51) Int. Cl.
*A61G 7/10* (2006.01)
*G01G 19/50* (2006.01)
(Continued)

(52) U.S. Cl.
CPC .......... *A61G 7/1067* (2013.01); *A61G 7/10* (2013.01); *A61G 7/108* (2013.01); *A61G 7/1013* (2013.01);
(Continued)

(58) Field of Classification Search
CPC .. A61G 7/1067; A61G 7/1015; A61G 7/1051; A61G 7/1065; A61G 7/108; A61G 2203/10; A61G 2203/40; A61G 2203/44; A61G 2203/70; A61G 7/1042; A61G 7/1061; A61G 7/1034; A61G 2203/30; A61G 2203/32; A61G 7/1078; A61G 7/1059; A61G 2200/16; A61G 2200/34; A61G 2203/12; A61G 2203/20;
(Continued)

(56) References Cited

U.S. PATENT DOCUMENTS 6,302,828 B1 * 10/2001 Martin ................... A61H 3/008
482/69
8,910,325 B2 12/2014 Faucher et al.
(Continued)

FOREIGN PATENT DOCUMENTS

CN 206675665 U 11/2017

*Primary Examiner* — David R Hare
*Assistant Examiner* — Madison Emanski
(74) *Attorney, Agent, or Firm* — Dinsmore & Shohl LLP (57) ABSTRACT

A person lifting apparatus includes a first lifting strap feeding device including a first drum and a first lifting strap wound on the first drum. A second lifting strap feeding device includes a second drum and a second lifting strap wound on the second drum. A controller is communicatively coupled to the first lifting strap feeding device and to the second lifting strap feeding device. The controller includes logic that controls operation of the first lifting strap feeding device and the second lifting strap feeding device based on a comparison of current draws of the first lifting strap feeding device and the second lifting strap feeding device.

20 Claims, 5 Drawing Sheets

(51) Int. Cl.
  *G01R 19/165* (2006.01)
  *G08B 5/00* (2006.01)
  *G08B 5/36* (2006.01)
  *B66D 3/20* (2006.01)
  *B66C 13/16* (2006.01)
  *B66C 15/00* (2006.01)
  *B66D 1/54* (2006.01)

(52) U.S. Cl.
  CPC ......... *A61G 7/1015* (2013.01); *A61G 7/1051* (2013.01); *A61G 7/1065* (2013.01); *B66C 13/16* (2013.01); *B66C 15/00* (2013.01); *B66D 3/20* (2013.01); *G01G 19/50* (2013.01); *G01R 19/16571* (2013.01); *G08B 5/00* (2013.01); *G08B 5/36* (2013.01); *A61G 7/1042* (2013.01); *A61G 7/1061* (2013.01); *A61G 7/1069* (2013.01); *A61G 7/1071* (2013.01); *A61G 7/1076* (2013.01); *A61G 2200/16* (2013.01); *A61G 2200/34* (2013.01); *A61G 2203/10* (2013.01); *A61G 2203/32* (2013.01); *A61G 2203/40* (2013.01); *A61G 2203/44* (2013.01); *A61G 2203/70* (2013.01); *B66D 1/54* (2013.01)

(58) Field of Classification Search
  CPC .. A61G 2203/42; A61G 2205/60; A61G 7/10; A61G 7/1013; A61G 7/1044; A61G 7/1046; A61G 7/1069; A61G 7/1071; A61G 7/1073; A61G 7/1076; A61G 7/109; G01G 19/50; G01R 19/16571; A61H 2201/5061; A61H 2201/5097; A61H 3/008; A61H 2201/0119; A61H 2201/0176; A61H 2201/018; A61H 2201/0184; A61H 2201/1207; A61H 2201/1215; A61H 2201/1652; A61H 2201/5007; A61H 2201/5038; A61H 2201/5043; A61H 2201/5064; A61H 2201/5069; A61H 2201/5092; A61H 2230/06; A45F 3/22; A61F 5/00; B66C 13/16; B66C 15/00; B65H 75/4484; B66D 1/54; B66D 3/20; G08B 5/00; G08B 5/36

See application file for complete search history.

(56) References Cited

U.S. PATENT DOCUMENTS

| | | |
|---|---|---|
| 9,463,128 B2 | 10/2016 | Ng |
| 9,510,991 B2 | 12/2016 | Stockmaster et al. |
| 9,693,922 B2 | 7/2017 | Andersson et al. |
| 9,757,297 B2 | 9/2017 | Arespong et al. |
| 2014/0013503 A1 | 1/2014 | Dixon et al. |
| 2014/0223660 A1 | 8/2014 | Bolin |
| 2017/0087392 A1 | 3/2017 | Lambert et al. |
| 2017/0354559 A1* | 12/2017 | Brulotte ............... A61G 7/1042 |

* cited by examiner

PERSON LIFTING APPARATUSES INCLUDING LIFTING STRAPS AND METHODS OF OPERATION BASED ON CURRENT DRAW

CROSS-REFERENCE

This application claims the benefit of and priority to U.S. Application No. 62/733,354, titled Person Lifting Apparatuses Including Lifting Straps and Methods of Operation Based on Current Draw, filed Sep. 19, 2018 and also to U.S. Application No. 62/878,508, titled Determining Lifting Events Using Sensors for Person Lifting Apparatuses, filed Jul. 25, 2019, the details of both of which are hereby incorporated by reference.

FIELD

The present specification generally relates to person lifting apparatuses and, in particular, person lifting apparatuses that include lifting straps, and methods for operating the same based on current draw.

TECHNICAL BACKGROUND

Person lifting systems, such as overhead lifts are often used to transport patients for any number of reasons. For example, overhead lifts may operate like a winch and include a lift motor and a lift drum that is driven by the lift motor. A lift strap may be coupled to the lift drum for lifting and lowering a patient when the drum is rotated and the lift strap is either wound up onto the lift drum or paid out from the lift drum. A sling bar device may be connected to an end of the lift strap. The sling bar device may include a load hook that connects to a patient lift sling.

Typical person lifting systems employ only a single lift strap operably connected to the lift drum. However, there may be instances where multiple lift straps may be desired. What is needed is a person lifting apparatus that includes multiple lifting straps.

SUMMARY

According to one aspect, a person lifting apparatus includes a first lifting strap feeding device including a first drum and a first lifting strap wound on the first drum. A second lifting strap feeding device includes a second drum and a second lifting strap wound on the second drum. A controller is communicatively coupled to the first lifting strap feeding device and to the second lifting strap feeding device. The controller includes logic that controls operation of the first lifting strap feeding device and the second lifting strap feeding device based on a comparison of current draws of the first lifting strap feeding device and the second lifting strap feeding device.

According to another aspect, a method of operating a person lifting apparatus is provided. The method includes controlling operation of a first lifting strap feeding device and a second lifting strap feeding device thereby tilting a patient supported by lifting straps connected to the first lifting strap feeding device and the second lifting strap feeding device. A current draw of the first lifting strap feeding device during operation is determined using a controller. A current draw of the second lifting strap feeding device during operation is determined using the controller. The current draws of the first lifting strap feeding device and the second lifting strap feeding device are compared. The controller controls operation of the first lifting strap feeding device and the second lifting strap feeding device based on the comparison of the current draws.

According to another aspect, a person lifting apparatus includes a first lifting strap feeding device including a first drum and a first lifting strap wound on the first drum. A second lifting strap feeding device includes a second drum and a second lifting strap wound on the second drum. A controller is communicatively coupled to the first lifting strap feeding device and to the second lifting strap feeding device. The controller includes logic that prevents operation of the first lifting strap feeding device and the second lifting strap feeding device is an imbalance condition is detected using a comparison of current draws of the first lifting strap feeding device and the second lifting strap feeding device.

Additional features of the person lifting apparatuses and methods for operating the person lifting apparatuses described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
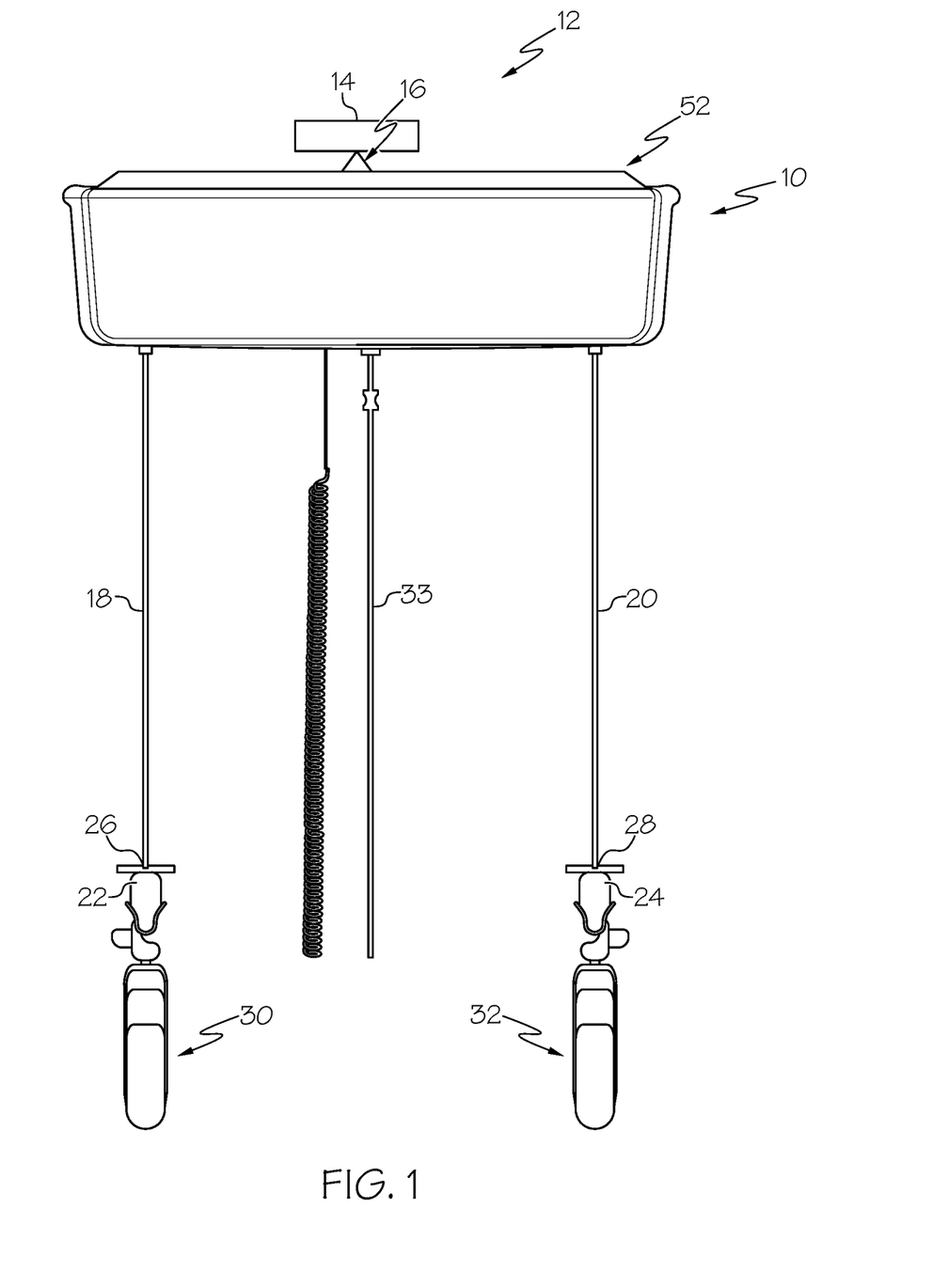
FIG. 1 is a front view of an overhead person lifting apparatus, according to one or more embodiments shown and described herein.

Reference will now be made in detail to embodiments of person lifting apparatuses and methods of operating the same, examples of which are illustrated in the accompanying drawings. Whenever possible, the same reference numerals will be used throughout the drawings to refer to the same or like parts. One embodiment of a person lifting apparatus is schematically depicted in FIG. 1, and is designated by the reference numeral 10. The person lifting apparatus may generally include two lift actuators operatively connected to accessory couplings via two lift straps, whereby each lift actuator raises and lowers the respective accessory coupling using the respective lift strap. The accessory couplings connect to a device, such as a sling bar device, which, in turn, can connect to a patient lift sling.

As two lift actuators and associated lift straps are used by the person lifting apparatuses, monitoring of the conditions of one of the lift actuators relative to the other of the lift actuators may be desired. For example, if one of the lift actuators is pulling much more current than the other of the lift actuators under operating conditions, an imbalance condition may be present. As will be described herein, the imbalance condition may be indicative of patient orientation as current draw can indicate load on the lift actuator due to patient position and weight distribution in a patient lift sling, as an example. As used herein, the terms "current draw" and "draw current" are used interchangeably to refer to an amount of current being provided by a power source under loading conditions. Various embodiments of person lifting apparatuses and methods for operating the same will be described herein with specific reference to the appended drawings.

Referring to FIG. 1, the person lifting apparatus 10 is part of an overhead patient lifting system 12 that includes one or more rails 14 that are secured or coupled to a support surface, such as a ceiling of a room. The person lifting apparatus 10 is movably coupled to the rail 14 by a carriage 16. In this embodiment, the person lifting apparatus 10 is configured to support and lift a patient with a pair of lifting straps 18 and 20. The lifting straps 18 and 20 may each include an accessory coupling 22 and 24 located at a free end 26 and 28 of the lifting straps 18 and 20. Sling bar devices 30 and 32 are illustrated connected to the accessory couplings 22 and 24. While sling bar devices 30 and 32 are illustrated, other accessories may be coupled to the lifting straps 18 and 20 depending on the desired lifting or other support operation. In some embodiments, a sling or harness may be coupled to both of the sling bar devices 30 and 32 to support a person for a person lifting and/or tilting operation. An emergency brake strap 33 may be provided that can be utilized to stop all operation of the person lifting apparatus 10 and hold the lifting straps 18 and 20 in their current positions.

Figure 2:
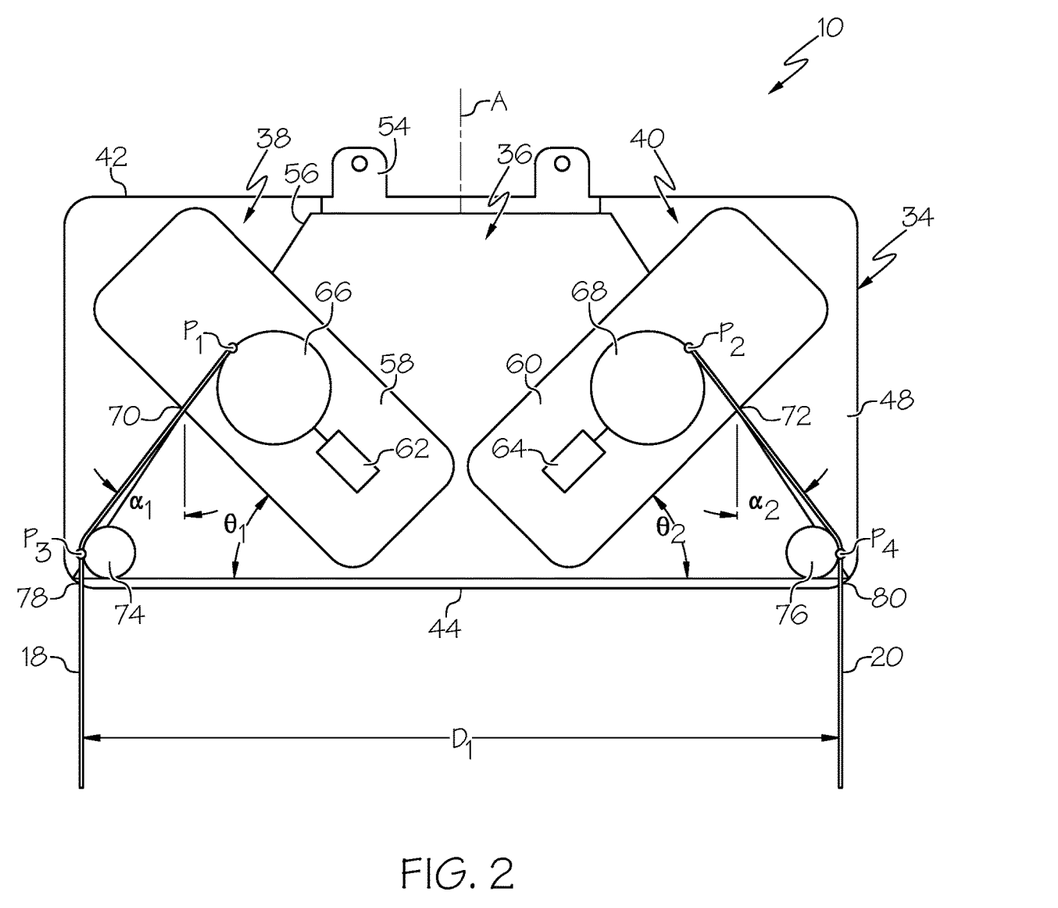
FIG. 2 is a schematic view of the overhead person lifting apparatus of FIG. 1, according to one or more embodiments shown and described herein.

Referring to FIG. 2, the person lifting apparatus 10 includes a housing 34 and a support structure 36 that is located in the housing 34 and supports a pair of lifting strap feeding devices 38 and 40 within the same housing 34. The lifting strap feeding devices 38 and 40 each wind up and pay out their respective lifting strap 18 and 20. The housing 34 includes a top 42, a bottom 44, sides 46, 48, a front 50 and a back 52 (FIG. 1) defining an enclosure that houses the lifting strap feeding devices 38 and 40. A hanging bracket 54 is located at the top 42 of the housing 34 and may be connected to the housing 34 and support structure 36. The hanging bracket 54 may also be part of or connected to the carriage 16 (FIG. 1) and allow for rotation of the housing 34 about a vertically oriented axis of rotation A. Rotation of the housing 34 using the carriage 16 may be effectuated manually and/or may be motorized. Manual rotation of the housing 34 may be caused, for example, by manually grasping one of the lifting straps 18 and 20 and/or the sling bar devices 30, 32 and applying a rotational force to the housing 34 by pulling the lifting straps 18 and 20 and/or the sling bar devices 30, 32. A brake or other stop mechanism may be used to inhibit rotation of the housing 34 when desired.

As can be seen in FIG. 2, the support structure 36 includes support components (represented by element 56, such as beams, brackets, fasteners, etc.) that support the lifting strap feeding devices 38 and 40. The strap feeding devices 38 and 40 generally include housings 58 and 60, lift actuators 62 and 64 (e.g., motors), and drums 66 and 68 that are rotated by the lift actuators 62 and 64 to wind up and pay out the lifting straps 18 and 20. The drums 66 and 68 may be coupled to a shaft of the lift actuators 62 and 64 and may be configured to extend and retract the lifting straps 18 and 20 as the lift actuators 62 and 64 rotate the drums 66 and 68 in response to a user providing an input to a control system via an input device. The strap feeding devices 38 and 40 are supported by the support structure 36 at angles $\theta_1$ and $\theta_2$ to horizontal. The support structure 36 supports the lifting strap feeding devices 38 and 40 at the angles $\theta_1$ and $\theta_2$ to horizontal such that lifting strap feed out locations 70 and 72 are not facing vertically or horizontally only, but also face outward at an angle to both vertical and horizontal. Such a non-horizontal and non-vertical arrangement for the lifting strap feeding devices 38 and 40 can allow the lifting strap feeding devices 38 and 40 to pay out the lifting straps 18 and 20 at angles $\alpha_1$ and $\alpha_2$ to vertical inside the housing 34 toward the sides 46 and 48 of the housing 34.

The lifting straps 18 and 20 may release from the drums 66 and 68 at points $P_1$ and $P_2$ where the lifting straps 18 and 20 are substantially tangent to their respective drum 66, 68. The lifting straps 18 and 20 are then directed over spacing rollers 74 and 76 that are spaced horizontally from the points $P_1$ and $P_2$ and offset horizontally from the drums 66 and 68 thereby increasing a horizontal spacing between the lifting straps 18 and 20 as they release from their drums 66 and 68 at points $P_1$ and $P_1$ to points $P_3$ and $P_4$ where they release from their spacing rollers 74 and 76. By the spacing rollers being "offset horizontally" from the drums, it is meant that a centerline of the spacing rollers is offset horizontally from a centerline of the drums. The points $P_3$ and $P_4$ may be spaced apart horizontally a predetermined distance $D_1$, such as between about 10 inches and about 30 inches. The predetermined distance $D_1$ depends on a number of factors including a maximum required distance between the free ends 26 and 28 of the lifting straps 18 and 20 under operating conditions. FIG. 2 illustrates the lifting straps 18 and 20 in a freely hanging configuration with the lifting straps 18 and 20 not in use for a lifting operation. In the freely hanging configuration, the lifting straps 18 and 20 hang from the spacing rollers 74 and 76 in a vertical orientation from the spacing rollers 74 and 76. The lifting straps 18 and 20 may extend downward from the spacing rollers 74 and 76 and exit the housing 34 at exit openings 78 and 80. While spacing rollers 74 and 76 are described, various other spacing members may be used that may or may not move or rotate.

Figure 3:
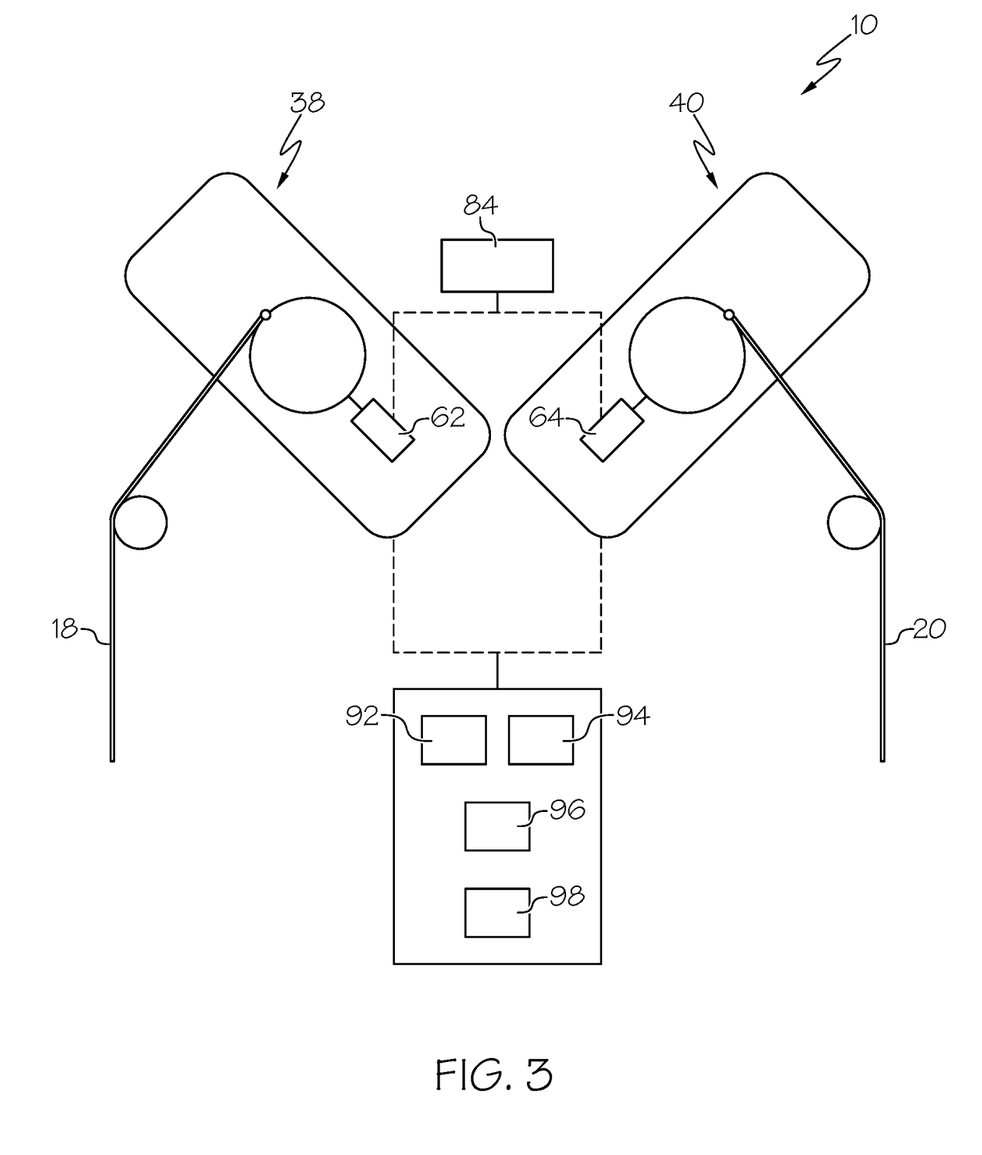
FIG. 3 is another schematic view of the overhead person lifting apparatus of FIG. 1, according to one or more embodiments shown and described herein.

Referring to FIG. 3, another schematic of operation of the person lifting apparatus 10 is illustrated including the lift actuators 62 and 64 and lifting straps 18 and 20 that are connected to the lift actuators 62 and 64. A controller 84 is operatively connected to the lift actuators 62 and 64 for controlling operation of the lift actuators 62 and 64, e.g., based on a user input using a user input device 90 (e.g., a remote control). The user input device 90 may be operably connected to the strap feeding devices 38 and 40 that feed the lifting straps 18 and 20, as discussed above, and/or connected to the controller 84. The user input device 90 may include tilt controls 92 and 94. As an example, the tilt control 82 may be a clockwise tilt control that, upon actuation, causes the strap feeding device 38 to wind up the lifting strap 18, while the strap feeding device 40 pays out the lifting strap 20. The tilt control 94 may be a counterclockwise tilt control that, upon actuation, causes the strap feeding device 38 to pay out the lifting strap 18, while the strap feeding device 40 winds up the lifting strap 20. In other embodiments, the tilt controls 92 and 94 may only raise and lower one of the lifting straps 18 and 20 (e.g., to move the head up and down while leaving the legs stationary). In some embodiments, the tilt controls 92 and 94 can be used to rotate a person from a prone position to a sitting position, for example.

The user input device 90 may also include up and down controls 96 and 98 that causes both strap feeding devices 38 and 40 to operate simultaneously to raise and lower the lifting straps 18 and 20 together. While the tilt controls 92, 94 and the up and down controls 96 and 98 are illustrated there may be other controls. For example, there may be individual up and down controls for each of the strap feeding devices 38 and 40. The user input device 90 may be wired or wirelessly connected to the strap feeding devices 38 and 40. The user input device 80 may control the strap feeding devices 38 and 40 directly, or controller 84 may receive input signals from the user input device 90.

The user input device 90 may be dedicated to controlling the strap feeding devices 38 and 40, such as a remote. In some embodiments, the user input device 90 may be a personal computing device, such as a smart phone or tablet that includes software that can be used to control operation of the strap feeding devices. Further, the user input device 90 and controller 84 may be connected to the internet for remotely controlling operation of the strap feeding devices 38 and 40.

During operation of the person lifting apparatus 10, the strap feeding devices 38 and 40 may be operated such that an imbalance condition is created. An imbalance condition may be due to, for example, paying out and/or retracting one of the lifting straps 18 and 20 an amount that causes a patient to tilt toward or away from one of the lifting straps 18 and 20 more than another beyond a predetermined amount. In these instances, one of the lift actuators 38 and 40 may experience a greater load than the other of the lift actuators 38 and 40.

Assuming the mapping from current to weight is linear, weight can be quantified based on current measurements. Comparing the ratio of currents pulled by the lift actuators 38 and 40 during operation to a predetermined value can be used to determine an imbalance condition. This predetermined value can be selected through clinical evaluations and assessments of patient loading using the two lifting straps 18 and 20, in order to accommodate different patient morphologies. Any non-linearities in the current-to-weight function may be addressed in logic using, for example, a look-up table and interpolation.

In the illustrated example, the controller 84 may include circuitry that reads the current being pulled by the lift actuators 48 and 50 from a power source. In some embodiments, an electronic measuring device may measure the current from the power source and provide an output to the controller 84. As an example, the predetermined value may be provided as a ratio of 1.5 that is saved in memory of the controller 84. The electronic measuring device may be part of the controller 84 and/or may be separate from the controller 84. Referring to the Table below, the first example illustrates a balance condition with a current ratio of 1.25, below the 1.5 predetermined value. The second example illustrates an imbalance condition with a current ratio of 1.75, above the predetermined value.

TABLE

| | Imbalance Condition | | | | |
| --- | --- | --- | --- | --- | --- |
| | Strap 1 Weight | Strap 1 Current | Strap 2 Weight | Strap 2 Current | Current Ratio | Imbalance Present? |
| Example 1 | 400 lbs | 10 A | 320 lbs | 8 A | 1.25 | No |
| Example 2 | 140 lbs | 3.5 A | 80 lbs | 2 A | 1.75 | Yes |

The controller 84, upon determining an imbalance condition exists, may take any one of a number of actions, such as to no longer allow tilting in a direction which increases the ratio. As another example, the controller 84 may tilt the person lifting apparatus 10 automatically in a direction that reduces the ratio. In some embodiments, there may be a scale of predetermined values and the action performed by the controller 84 may depend on the magnitude of the imbalance. Since the controller 84 can continually monitor the current ratio, a ratio of 1.75 may be unlikely. However, such a condition may be present, for example, when a support is suddenly removed. While the predetermined value described above is greater than 1, the predetermined value may below 1, such as 0.5 or below, depending on how the calculation is made. The controller 84 may further provide an indication to a user that an imbalance condition is present (e.g., visual and/or audible).

Figure 4A:
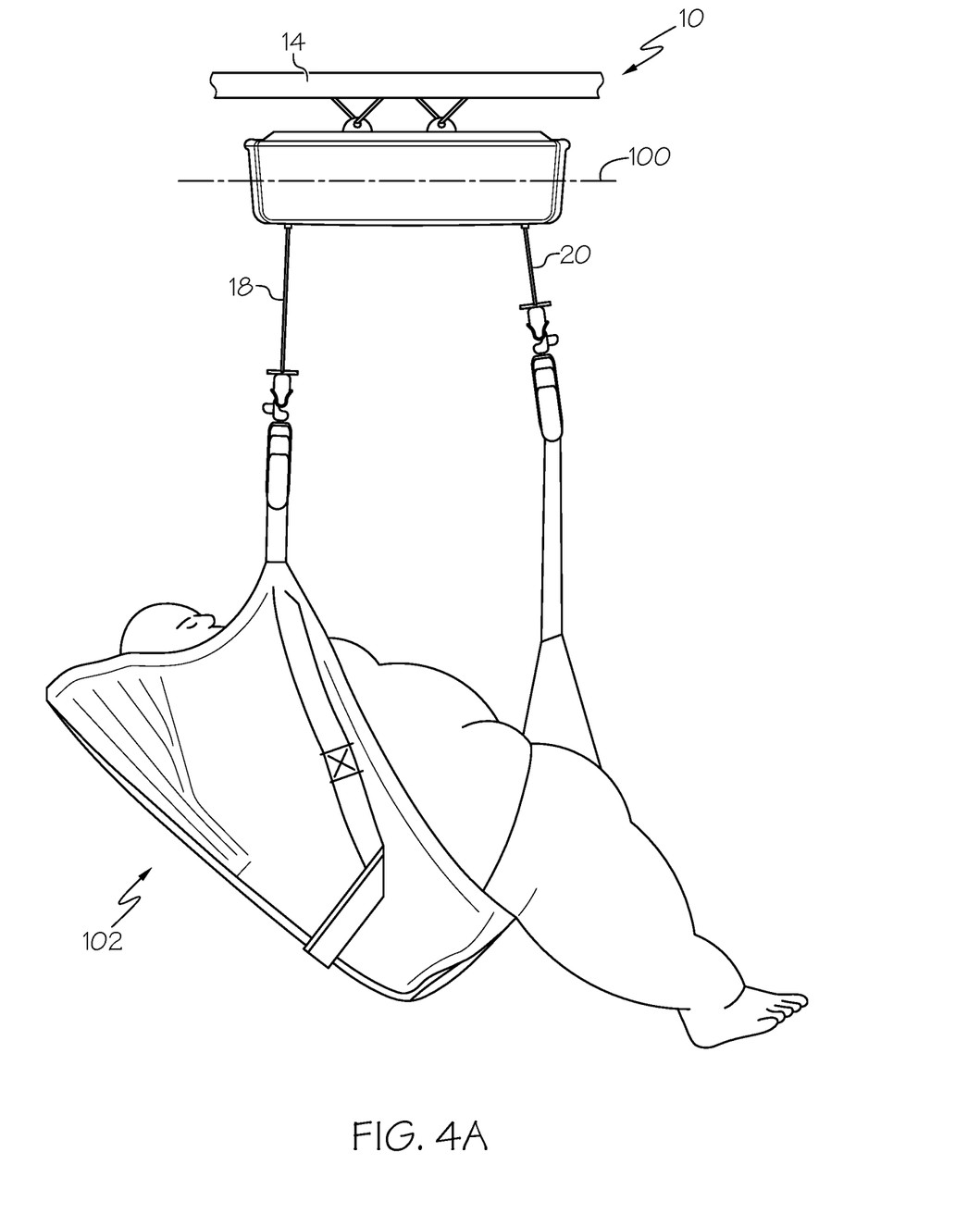
FIG. 4A is a side view of the overhead lifting apparatus of FIG. 1 in use, according to one or more embodiments shown and described herein.
Figure 4B:
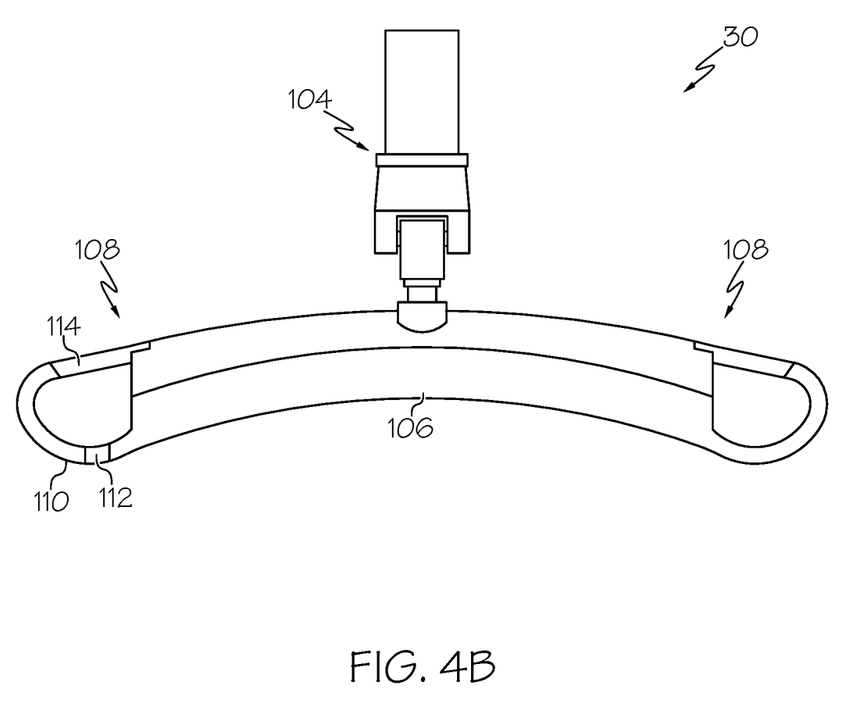
FIG. 4B is a front view of a sling bar device for use with the overhead lifting apparatus of FIG. 4A, according to one or more embodiments shown and described herein.

Referring to FIG. 4A, the person lifting apparatus 10 is illustrated with its long axis 100 parallel with a direction of travel along the rail 14. A sling 102 is illustrated connected to the sling bar devices 30 and 32. As shown in FIG. 4B, the sling bar devices 30, 32 (only sling bar device 30 is shown) includes a connector 104 for coupling the sling bar device 30 to the person lifting apparatus 10. The connector 104 is fixedly coupled to the sling bar device 30 in FIG. 4B, although in other embodiments, the connector 104 may be movably coupled to the sling bar device 30. Allowing the connector 104 to move with respect to the sling bar device 30 may help to decrease the torque forces on the connector 104 when the sling 102 is coupled to the sling bar device 30, maintain the alignment of the sling 102, sling bar device 30, and person lifting apparatus 10, and prevent twisting of various components.

The sling bar device 30 includes an elongated bar 106 and two hooks 108 coupled to the distal ends of the elongated bar 106. In other embodiments, the sling bar device 30 may be an X-shaped sling bar that includes two curved frame members coupled by a middle frame member and including four support apparatus coupling mechanisms. In still other embodiments, the sling bar may include a U-shaped frame including two support apparatus coupling mechanisms and a U-shaped handle extending from the frame to provide stability to a subject being lifted. Other sling bar configurations are contemplated. Various sling bar configurations are described in greater detail in U.S. Pat. No. 9,757,297, entitled "Person Lift System."

The hooks 108 include a coupling base 110 with a recessed space 112 therein and a latch 114 configured to selectively enclose the recessed space 112. The latch 114 is pivotally coupled to the coupling base 110 and is configured to extend across the recessed space 112 in a closed position and rotate towards the recessed space 112 in an open position. In operation, when a user couples the sling 102 to the hook 108, the user lifts the latch 114 (i.e., rotates the latch 114 away from the recessed space 112), to allow the strap(s) or other portion of the sling 102 to be inserted into the recessed space 112. When a user removes the sling 102 from the hook 108, the user lifts the latch 114 to rotate the latch 114 toward an open position (i.e., rotates the latch 114 away from the recessed space 112) such as with a sling strap to allow the sling 102 to be removed from the recessed space 112.

Suitable sling bars include, by way of example and not limitation, those commercially available under the trade name SlingGuard from Liko, HILL-ROM®, or Hill-Rom Services, Inc. (Batesville, Ind.). Additionally, it is contemplated that some embodiments may not include a sling bar.

The above-described person lifting systems provides a multiple lifting strap solution for supporting, raising and lowering, and tilting persons. The multiple strap feeding devices along with the associated lifting straps can support various body types, such as bariatric patients that need assistance in raising and lowering their bodies. For example, the strap feeding devices may each be rated up to 550 pounds each for a total of 1100 pounds. However, the strap feeding devices may be rated for more or less than 550 pounds each. Further, the strap feeding devices may be operated together or separately to raise and lower the lifting straps together or separately. The person lifting systems include a current monitoring system that includes a controller including logic that compares current draw of the lift actuators, determines a ratio and compares the ratio to a predetermined threshold. If the ratio of the current draw of the lift actuators is outside the predetermined threshold, then the controller may discontinue operation of the lift actuators or take some other action. Further while a single person lifting system with a pair strap feeding devices and associated lifting straps is discussed above, two separate person lifting devices, each with a single strap feeding device and associated lifting strap may be used.

Embodiments can be described with reference to the following numbered clauses, with preferred features laid out in the dependent clauses:

1. A person lifting apparatus comprising: a first lifting strap feeding device comprising a first drum and a first lifting strap wound on the first drum; a second lifting strap feeding device comprising a second drum and a second lifting strap wound on the second drum; and a controller communicatively coupled to the first lifting strap feeding device and to the second lifting strap feeding device, the controller includes logic that controls operation of the first lifting strap feeding device and the second lifting strap feeding device based on a comparison of current draws of the first lifting strap feeding device and the second lifting strap feeding device.

2. The person lifting apparatus of clause 1, wherein the controller includes the logic that controls operation of the first lifting strap feeding device and the second lifting strap feeding device based on a ratio of the current draw of the first lifting strap feeding device and the current draw of the second strap feeding device.

3. The person lifting apparatus of clause 2, wherein the controller includes the logic that compares the ratio to a predetermined value.

4. The person lifting apparatus of clause 3, wherein the controller includes the logic that prevents operation of one or both of the first lifting strap feeding device and the second lifting strap feeding device if the ratio is above the predetermined value.

5. The person lifting apparatus of clause 4, wherein the controller includes the logic that prevents operation of one or both of the first lifting strap feeding device and the second lifting strap feeding device to prevent tilting in a direction which increases the ratio.

6. The person lifting apparatus of clause 5, wherein the controller includes the logic that allows operation of one or both of the first lifting strap feeding device and the second lifting strap feeding device to allow tilting in a direction which decreases the ratio.

7. The person lifting apparatus of clause 3, wherein the controller includes the logic that provides an indication to a user that an imbalance condition is present.

8. The person lifting apparatus of clause 1, wherein the first lifting strap feeding device and the second lifting strap feeding device are located in a same housing.

9. A method of operating a person lifting apparatus, the method comprising: controlling operation of a first lifting strap feeding device and a second lifting strap feeding device thereby tilting a patient supported by lifting straps connected to the first lifting strap feeding device and the second lifting strap feeding device; determining a current draw of the first lifting strap feeding device during operation using a controller; determining a current draw of the second lifting strap feeding device during operation using the controller; comparing the current draws of the first lifting strap feeding device and the second lifting strap feeding device; and the controller controlling operation of the first lifting strap feeding device and the second lifting strap feeding device based on the comparison of the current draws.

10. The method of clause 10, wherein the controller controlling operation of the first lifting strap feeding device and the second lifting strap feeding device based on a ratio of the current draw of the first lifting strap feeding device and the current draw of the second strap feeding device.

11. The method of clause 10, wherein the controller comparing the ratio to a predetermined value.

12. The method of clause 11, wherein the controller preventing operation of one or both of the first lifting strap feeding device and the second lifting strap feeding device if the ratio is above the predetermined value.

13. The method of clause 12, wherein the controller preventing operation of one or both of the first lifting strap feeding device and the second lifting strap feeding device to prevent tilting in a direction which increases the ratio.

14. The method of clause 13, wherein the controller allowing operation of one or both of the first lifting strap feeding device and the second lifting strap feeding device to allow tilting in a direction which decreases the ratio.

15. The method of clause 11, wherein the controller providing an indication to a user that an imbalance condition is present.

16. The method of clause 9, wherein the first lifting strap feeding device and the second lifting strap feeding device are located in a same housing.

17. A person lifting apparatus comprising: a first lifting strap feeding device comprising a first drum and a first lifting strap wound on the first drum; a second lifting strap feeding device comprising a second drum and a second lifting strap wound on the second drum; and a controller communicatively coupled to the first lifting strap feeding device and to the second lifting strap feeding device, the controller includes logic that prevents operation of the first lifting strap feeding device and the second lifting strap feeding device is an imbalance condition is detected using a comparison of current draws of the first lifting strap feeding device and the second lifting strap feeding device.

18. The person lifting apparatus of clause 17, wherein the controller includes the logic that controls operation of the first lifting strap feeding device and the second lifting strap feeding device based on a ratio of the current draw of the first lifting strap feeding device and the current draw of the second strap feeding device.

19. The person lifting apparatus of clause 18, wherein the controller includes the logic that compares the ratio to a predetermined value.

20. The person lifting apparatus of clause 19, wherein the controller includes the logic that prevents operation of one or both of the first lifting strap feeding device and the second lifting strap feeding device if the ratio is above the predetermined value.

Based on the foregoing, it should be understood that the person lifting apparatuses described herein provide multiple lifting straps along with a controller that monitors and compares current draws from their associated lifting strap feeding devices to detect an imbalance condition.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A person lifting apparatus comprising:
a first lifting strap feeding device comprising a first drum and a first lifting strap wound on the first drum;
a second lifting strap feeding device comprising a second drum and a second lifting strap wound on the second drum; and
a controller communicatively coupled to the first lifting strap feeding device and to the second lifting strap feeding device, the controller includes logic, the logic configured to compare a plurality of current draw values when a load is present on both the first and second lifting straps, wherein the current draw values include a first and second current draw value, wherein the first current value results from a first load, and the second current value results from a second load, the logic configured to cause the controller to determine an imbalance value through a comparison of the current draw values of both the first lifting strap feeding device and the second lifting strap feeding device indicative of the loads, and compares the imbalance value to a predetermined value stored in the controller to detect an imbalance condition between the first and second lifting strap feeding devices, and control operation of both the first lifting strap feeding device and the second lifting strap feeding device when an imbalance condition is detected between the first and second lifting strap feeding devices.

2. The person lifting apparatus of claim 1, wherein the predetermined value is a predetermined ratio, the controller includes the logic that uses a determined ratio of the first and second current value results to control operation of the first lifting strap feeding device and the second lifting strap feeding device based on the predetermined ratio.

3. The person lifting apparatus of claim 2, wherein the controller includes the logic that compares the determined ratio to the predetermined ratio.

4. The person lifting apparatus of claim 3, wherein the controller includes the logic that uses the determined ratio to prevent operation of one or both of the first lifting strap feeding device and the second lifting strap feeding device if the determined ratio is above the predetermined ratio.

5. The person lifting apparatus of claim 4, wherein the controller includes the logic that uses the determined ratio to prevent operation of one or both of the first lifting strap feeding device and the second lifting strap feeding device to prevent tilting in a direction which increases the determined ratio.

6. The person lifting apparatus of claim 5, wherein the controller includes the logic that uses the determined ratio to allow operation of one or both of the first lifting strap feeding device and the second lifting strap feeding device to allow tilting in a direction which decreases the determined ratio.

7. The person lifting apparatus of claim 3, wherein the controller includes the logic that provides an indication to a user that an imbalance condition is present.

8. The person lifting apparatus of claim 1, wherein the first lifting strap feeding device and the second lifting strap feeding device are located in a same housing.

9. A method of operating a person lifting apparatus, the method comprising:
controlling operation of a first lifting strap feeding device and a second lifting strap feeding device thereby tilting a patient supported by lifting straps connected to the first lifting strap feeding device and the second lifting strap feeding device;
determining a first current draw value of the first lifting strap feeding device during operation and when a load is present using a controller;
determining a second current draw value of the second lifting strap feeding device and when a load is present during operation using the controller;
comparing the first and second current draw values of the first lifting strap feeding device and the second lifting strap feeding device;
the controller determining an imbalance value through a comparison of both the first and second current draw values of the first and second lifting strap feeding devices indicative of the loads and comparing the imbalance value to a predetermined value stored in the controller; and
the controller controlling operation of both the first lifting strap feeding device and the second lifting strap feeding device when an imbalance condition is detected between the first and second lifting strap feeding devices.

10. The method of claim 9, wherein the predetermined value is a predetermined ratio, the controller using a determined ratio of the first and second current value results to control operation of the first lifting strap feeding device and the second lifting strap feeding device based on the predetermined ratio.

11. The method of claim 10, wherein the controller comparing the determined ratio to the predetermined ratio.

12. The method of claim 11, wherein the controller uses the determined ratio to prevent operation of one or both of the first lifting strap feeding device and the second lifting strap feeding device if the determined ratio is above the predetermined ratio.

13. The method of claim 12, wherein the controller preventing operation of one or both of the first lifting strap feeding device and the second lifting strap feeding device to prevent tilting in a direction which increases the determined ratio.

14. The method of claim 13, wherein the controller allowing operation of one or both of the first lifting strap feeding device and the second lifting strap feeding device to allow tilting in a direction which decreases the determined ratio.

15. The method of claim 9, wherein the controller providing an indication to a user that an imbalance condition is present.

16. The method of claim 9, wherein the first lifting strap feeding device and the second lifting strap feeding device are located in a same housing.

17. A person lifting apparatus comprising:
a first lifting strap feeding device comprising a first drum and a first lifting strap wound on the first drum;
a second lifting strap feeding device comprising a second drum and a second lifting strap wound on the second drum; and
a controller communicatively coupled to the first lifting strap feeding device and to the second lifting strap feeding device, the controller includes logic that is configured to use a determined ratio between a first current draw value of the first lifting strap device and a second current draw value of the second lifting strap feeding device, wherein the first and second current draw values indicative of loads carried by the first and second lifting strap devices, respectively, are compared by the controller to detect an imbalance condition.

18. The person lifting apparatus of claim 17, wherein the controller includes the logic that compares the determined ratio to a predetermined ratio.

19. The person lifting apparatus of claim 18, wherein the controller includes the logic that prevents operation of one or both of the first lifting strap feeding device and the second lifting strap feeding device if the determined ratio is above the predetermined ratio.

20. The person lifting apparatus of claim 19, wherein the controller includes the logic that uses the determined ratio to allow operation of one or both of the first lifting strap feeding device and the second lifting strap feeding device to allow tilting in a direction which decreases the determined ratio.

* * * * *